United States Patent [19]

Blake

[11] Patent Number: 6,157,223
[45] Date of Patent: Dec. 5, 2000

[54] OUTPUT BUFFER WITH SWITCHING PMOS DRIVERS

[75] Inventor: Terence G. W. Blake, Dallas, Tex.

[73] Assignee: Texas Instruments Incorporated, Dallas, Tex.

[21] Appl. No.: 09/212,134

[22] Filed: Dec. 15, 1998

Related U.S. Application Data

[60] Provisional application No. 60/068,591, Dec. 23, 1997.

[51] Int. Cl.$^7$ ...................................................... H03B 1/00
[52] U.S. Cl. ........................................... 327/108; 327/109
[58] Field of Search ..................................... 327/108, 109, 327/112, 379, 380, 381, 388; 326/27, 82, 83, 87

[56] References Cited

U.S. PATENT DOCUMENTS

| 4,962,345 | 10/1990 | Crafts et al. | 307/270 |
| 5,939,931 | 8/1999 | Noro | 327/424 |
| 5,995,010 | 11/1999 | Blake et al. | 340/653 |

*Primary Examiner*—Kenneth B. Wells
*Assistant Examiner*—Linh Nguyen
*Attorney, Agent, or Firm*—Gerald E. Laws; W. James Brady, III; Frederick J. Telecky, Jr.

[57] ABSTRACT

An output buffer with switching PMOS drivers (10) is disclosed. According to one embodiment, output buffer (10) includes a first output driver (62) and a second output driver (68). A first output cascode (64) coupled to the first output driver (62) protects the gate oxide of the first output driver (62) from voltage changes on the output (16). A second output cascode (66) coupled to the second output driver (68) protects the gate oxide of the second output driver (68) from voltage changes on the output (16). A level shifter (30) includes multiple cascode devices (46, 48, 50, 52) and switches the first output driver (62) according to the values of a data input (12) and an enable input (14). Switching circuitry (60) coupled to the second output cascode (64) allows the first output cascode (64) to protect the gate oxide of the first output driver (62) and provides extra drive for the output buffer (10).

20 Claims, 1 Drawing Sheet

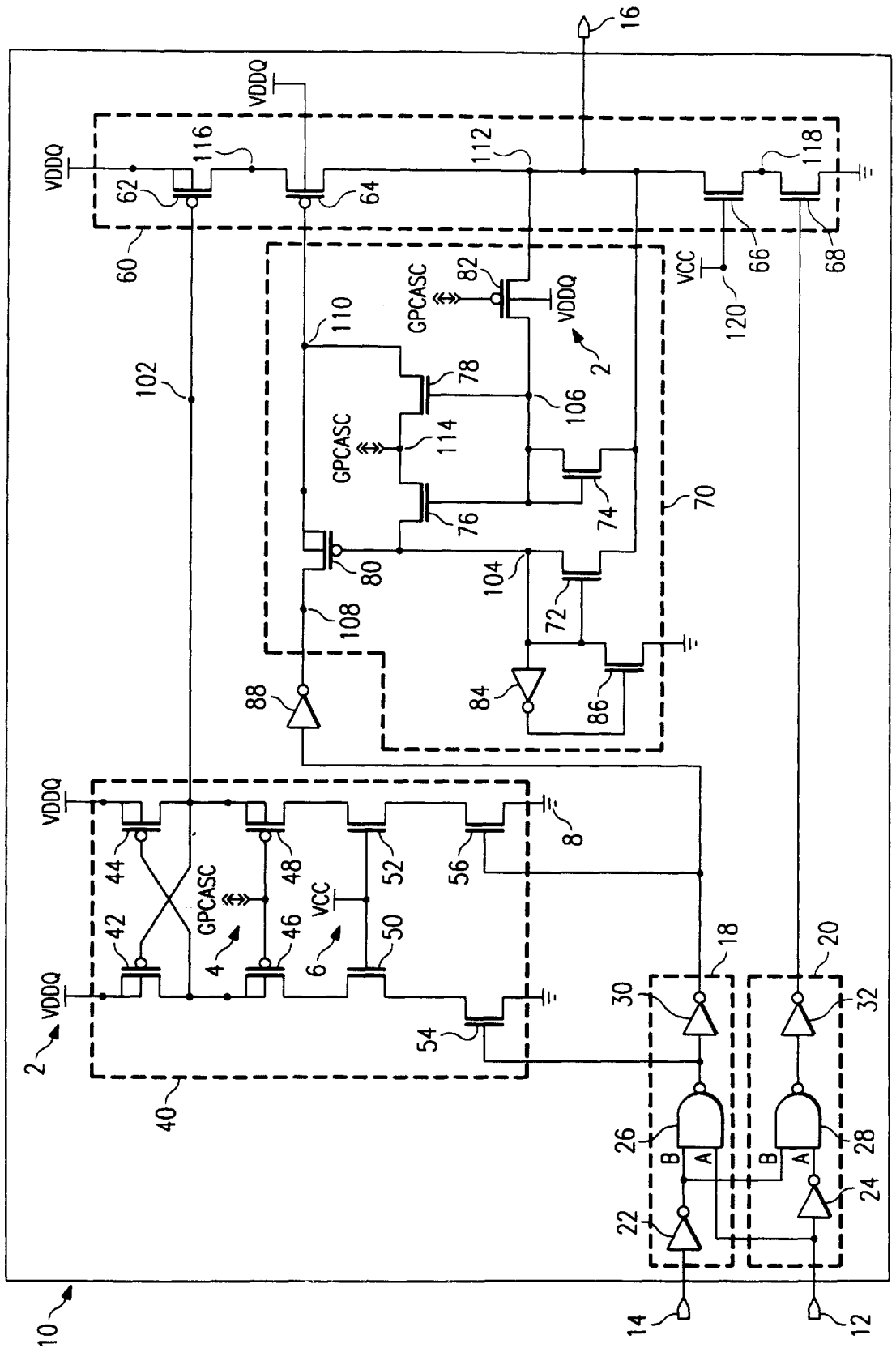

6,157,223

OUTPUT BUFFER WITH SWITCHING PMOS DRIVERS

This application claims priority under 35 USC §119(e)(1) of Provisional application No. 60/068,591, filed Dec. 23, 1997.

TECHNICAL FIELD OF THE INVENTION

This invention relates generally to the field of electronic circuits, and more particularly to an output buffer with switching PMOS drivers.

BACKGROUND OF THE INVENTION

Modern ICs often interface with complementary metal-oxide semiconductor (CMOS) voltage levels on chips from previous technology generations. In order to interface with such voltage levels, ICs must include output buffers capable of driving high to an output much greater than the source voltage.

Many output buffer circuits are coupled to one or more power supplies and use output drivers to switch an output voltage according to the values of one or more inputs. For example, an output buffer that receives a high voltage (VDDQ) from a first power supply and an internal chip core voltage (VCC) from a second power supply might have p-channel and n-channel output drivers to switch an output voltage according to values of a data input and an enable input. Typically, output buffers have only a single thin gate oxide. The single thin gate oxide becomes overstressed by a gate-drain voltage much above the source voltage. It is often desirable to protect the gate oxides of these output drivers and other components of the output buffer from overstress, breakdown or other damage due to changes in voltage on the output. Typically, the gate oxide of a transistor can withstand DC voltages ($VGD_{max}$) only up to approximately VCC plus a transistor threshold voltage (VT), a fact which motivates much of the circuitry of the present invention.

As microelectronic devices become increasingly complex to satisfy additional processing requirements, reducing the failure of devices during operation becomes increasingly important. A known technique for protecting the gate oxide of output drivers includes coupling cascode devices in series with the output drivers, and in a level shifter, to turn off the switching output P-driver. The cascode devices are supposed to prevent their drains from being pulled past their gate potentials and overstressing the gate oxides of neighboring devices. The cascode devices thus shield the gate oxide of the output driver from voltage levels on the output. The gates of the cascode devices are maintained at fixed voltages, such that the voltage across a gate oxide does not exceed the gate oxide's maximum fixed voltage tolerance. Having the cascode devices at fixed voltages, however, is not optimum for performance. For example, the cascode device gates may remain at an intermediate reference voltage between VDDQ and ground and thus provide minimal drive.

SUMMARY OF THE INVENTION

Therefore, a need has arisen for an output buffer that addresses the disadvantages and deficiencies of the prior art.

An output buffer with switching PMOS drivers is disclosed. According to one embodiment of the present invention, an output buffer coupling a data input and an enable input to an output receives a first voltage from a first power supply and a second voltage from a second power supply. The output buffer includes a first output driver having a gate and a gate oxide. A first output cascode coupled to the first output driver and to the output protects the gate oxide of the first output driver from voltage changes on the output. A level shifter coupled to the data input, the enable input and the first output driver includes multiple cascode devices and provides a voltage to switch the first output driver according to the values of the data input and the enable input. Switching circuitry coupled to the enable input and to the gate of the first output cascode enables the first output cascode to prevent stress on the gate oxide of the first output driver.

A technical advantage of the present invention is that the drain of the first output driver is not pulled below a threshold voltage above the chip voltage source, thereby preventing stress on the gate oxide of the first output driver. Another technical advantage is that there is a cascode gate voltage during the beginning of pullup, thereby providing more current drive. Another technical advantage is that the output drivers and cascodes may be narrower, with less area and gate capacitance, for a given output risetime.

BRIEF DESCRIPTION OF THE DRAWINGS

For a more complete understanding of the present invention and for further features and advantages thereof, reference is now made to the following description taken in conjunction with the accompanying drawing, in which:

FIG. 1 is a schematic diagram of an output buffer circuit constructed in accordance with the present invention.

DETAILED DESCRIPTION OF THE INVENTION

FIG. 1 illustrates an exemplary output buffer 10 for complementary metal-oxide semiconductor (CMOS) applications coupled to a high voltage power supply that provides a voltage (VDDQ) of approximately 3.0 V to approximately 3.6 V to output buffer 10. Output buffer 10 is coupled to a data input 12, an enable input 14, and an output 16. Data input 12, enable input 14 or both data input 12 and enable input 14 may have a low or "0" value corresponding to ground or any other suitable reference voltage, or a high or "1" value that corresponds to the chip core voltage (VCC) of the electronic device that contains output buffer 10, which may be approximately 1.65 V to approximately 1.95 V for typical applications. In one embodiment, VDDQ is approximately 3.3 V and VCC is approximately 1.8 V, which is approximately one-half of VDDQ. The present invention contemplates any suitable combination of VDDQ and VCC.

In general, output buffer 10 converts an intermediate voltage (VCC) signal on data input 12 to a higher voltage (VDDQ) signal on output 16. The devices that form output buffer 10 may have any dimensions suitable to provide output buffer 10 with adequate drive strength, adequate speed in switching output between low and high according to values of data input and enable input, and acceptably low leakage current when output is in a high-impedance or non-asserted state.

Output buffer 10 includes p-channel pre-driver logic (PPDL) 18 having inverter 22, NAND gate 26, and inverter 30. PPDL 18 couples data input 12 and enable input 14 to switching n-channels 54 and 56 of level shifter 40. Output buffer 10 also includes n-channel pre-driver logic (NPDL) 20 having inverter 24, NAND gate 28, and inverter 32. NPDL 20 couples data input 12 and inverter 22 of PPDL 18 to an n-channel output driver (NCOD) 68. Other appropriate elements may replace or combine with inverters 22 and 24, NAND gates 26 and 28, and inverters 30 and 32 according to particular needs.

Output buffer 10 also includes a level shifter 40 designed to provide VDDQ to the gate (node 102) of p-channel output driver (PCOD) 62 to switch PCOD 62 according to the values of data input 12 and enable input 14. Level shifter 40 includes p-channel pull-ups 42 and 44, p-channel cascodes 46 and 48, n-channel cascodes 50 and 52, and switching n-channels 54 and 56. P-channel pull-ups 42 and 44 are coupled to power supply (VDDQ) 2. P-channel cascodes 46 and 48 are coupled to voltage (GPCASC) 4. N-channel cascodes 50 and 52 are coupled to power supply (VCC) 6. VCC is in the range of approximately 1.65 V to approximately 1.95 V. GPCASC is high and is tied either to VCC (which is approximately equal to $VGD_{max}$) or to a reference voltage, which is approximately equal to VDDQ—$VGD_{max}$. Switching n-channels 54 and 56 are coupled to a ground or any other suitable reference voltage 8. Level shifter 40 may include p-channel metal-oxide-semiconductor (PMOS) and n-channel metal-oxide-semiconductor (NMOS) devices in any suitable combination.

Output buffer 10 also includes output drivers and cascodes 60. Output drivers and cascodes 60 includes p-channel output driver (PCOD) 62, p-channel output cascode (PCOC) 64, n-channel output cascode (NCOC) 66 and n-channel output driver (NCOD) 68. The gate of PCOD 62 is coupled to level shifter 40, the gate of PCOC 64 is coupled to switching circuitry 70, the gate of NCOC 66 is tied to VCC, and the gate of NCOD 68 is coupled to NPDL 20.

Output buffer 10 further includes switching driver circuitry 70. Switching circuitry 70 includes diode-NFETs 72 and 74, n-channels 76 and 78, p-channels 80 and 82, and half-latch 84 and 86. Inverter 88 couples the output of PPDL 14 to switching circuitry 70. Other appropriate elements may replace or combine with diode-NFETs 72 and 74, n-channels 76 and 78, p-channels 80 and 82, and half-latch 84 and 86 according to particular needs.

Switching circuitry 70 pulls the potential of PCOC 64 down to a threshold voltage (VtP) above ground when the output is low but to be pulled high. This low voltage is an important technical advantage of the present invention. By providing a lower gate voltage on PCOC 64, output buffer 10 enables PCOC 64 to pull up with more strength (i.e., more drive).

In operation of output buffer 10, n-channel devices do not pull their respective nodes higher than their respective gate voltages minus their respective threshold voltages. P-channel devices do not pull their respective nodes lower than their respective threshold voltages above their respective gate voltages. For example, if the difference between VDDQ and VCC, which is approximately VCC when VCC is approximately one-half of VDDQ, is near the maximum gate oxide stress, then VCC is approximately the lowest voltage a p-channel driver can tolerate. Similarly, if VCC is near the maximum gate oxide stress, then VCC is approximately the highest voltage that an n-channel driver can tolerate.

In operation of level shifter 40, if data input 12 is high and enable input 14 is low, NCOD 68 is off, switching n-channel 54 is off, switching n-channel 56 is on, p-channel pull-up 42 is on, p-channel pull-up 44 is off, PCOD 62 is on, and output 16 is driven high to approximately VDDQ in an asserted state. As a result, the value of data input 12 is effectively transmitted through output buffer 10 to output 16. Alternatively, if data input 12 is low and enable input 14 is low, NCOD 68 is on, switching n-channel 54 is on, switching n-channel 56 is off, p-channel pull-up 42 is off, p-channel pull-up 44 is on, PCOD 62 is off, and output 16 is low or at ground in an asserted state. Finally, if enable input 14 is high, whether data input 12 is high or low, NCOD 68 is off, switching n-channel 54 is on, switching n-channel 56 is off, p-channel pull-up 42 is off, p-channel pull-up 44 is on, PCOD 62 is off, and output 16 is in a high-impedance non-asserted state with a variable value.

If enable input 14 is high, the voltages at nodes 116 and 118 will depend on the value of output 16, which may vary according to the operation of another electronic device associated with output buffer 10. For the arrangement shown in FIG. 1, the voltage at node 116 may range from approximately 3.3 V (VDDQ) to approximately 1.65 V (one-half of VDDQ) plus the VT associated with PCOD 62. The voltage at node 118 may range from zero (ground) to approximately VCC, or approximately 1.65 V (approximately one-half of VDDQ) minus the VT associated with NCOD 68. The present invention contemplates other suitable voltages at nodes 116 and 118 according to the values of data input 12, enable input 14, and output 16 during operation of output buffer 10. This protection mechanism performed by PCOC 64 and NCOC 66 additionally applies to p-channel cascodes 46 and 48 and n-channel cascodes 50 and 52 of level shifter 40.

In sum, if data input 12 is low and enable input 14 is low, gate 102 of PCOD 62 is driven to approximately VDDQ and PCOD 62 is turned off. In the alternative, if data input 12 is high, gate 102 of PCOD 62 is driven to approximately one-half of VDDQ and PCOD 62 is on. The present invention contemplates shifting the gate voltage of PCOD 62 according to the values of data input 12 and enable input 14 in any suitable manner.

NCOC 66 protects the gate oxide of NCOD 68. NCOC 66 has a threshold voltage (VT) and will not pull its source 118 above one VT below the voltage at its gate 120, which is maintained at approximately VCC, or approximately one-half of VDDQ. As a result, if output 16 is high at VDDQ and NCOD 68 is on according to the values of data input 12 and enable input 14, the voltage at node 118 goes low to ground, NCOC 66 is turned on, and the voltage across the gate oxide of NCOD 68 and NCOC 66 is not sufficient to overstress, break down, or damage this gate oxide. If output 16 is high at VDDQ and NCOD 68 is off according to the values of data input 12 and enable input 14, the voltage at node 118 is pulled up to the voltage at node 120 minus VT, whereupon NCOC 66 is turned off, and the voltages across the gate oxide of NCOD 68 are again less than the maximum that the gate oxide can tolerate.

PCOC 64 operates in a similar manner to protect the gate oxide of PCOD 62 if output 16 goes to ground. In general, if output 16 goes to ground, the voltage at node 116 is not allowed to go lower than one-half VDDQ plus VT due to PCOC 64, and the voltage from node 116 to node 102 (which is at VDDQ due to level shifter 40) across the gate oxide of PCOD 62 is less than the maximum the gate oxide can tolerate without overstressing, breaking down, or otherwise being damaged.

PCOC 64 has a threshold voltage (VT) and will not pull its source to below one VT above its gate voltage. Its gate voltage is determined by switching circuitry 70. The body of PCOC 64 is additionally coupled to and receives VDDQ from power supply 2.

When output 16 is low, node 104 is pulled low by diode-NFET 72 and to ground by n-channel 86. Node 106 is pulled down by diode-NFET 74, turning off n-channels 76 and 78. If enable input 14 is low and data input 12 is high, node 108 is pulled low. P-channel 80 then pulls node 110, the gate of PCOC 64, a threshold voltage (VtP) above ground. This happens while the output 16 begins to rise from ground. PCOC 64 gets extra drive as it begins to pull up the output 16, when its gate (node 110) gets pulled down temporarily. This extra drive allows PCOD 62 and PCOC 64 to be narrower, with less area and gate capacitance, for a given output risetime.

When output 16 (node 112) goes above VtP+GPCASC, p-channel cascode 82 pulls node 106 up to node 112 (i.e., node 106 is pulled high). This turns on n-channels 76 and 78. The gate of p-channel 80 is pulled up to GPCASC by n-channel 76. P-channel 80 turns off. Node 110, cut off from inverter 88, is pulled up to GPCASC by n-channel 78. Node 114 (between n-channels 76 and 78) must be able to source significant current to charge the gate capacitance of PCOC 64. This leaves PCOC 64 on, since nodes 112 and 116 have been pulled high. GPCASC is high enough that the gate oxide of PCOC 64 is not stressed. In other words, the drive is now reduced, but the gate-to-source voltage (VGS) and gate-to-drive voltage (VGD) of PCOC 64 are less than $VGD_{max}$.

If enable input 14 then goes high or data input 12 goes low, PCOD 62 is turned off by the level shifter 40. If output 16 is pulled down, p-channel 82 pulls node 106 down to GPCASC+VtP. If it gets a VtN below that, then diode-NFET 74 pulls node 106 down further, turning off n-channels 76 and 78. Diode-NFET 72 similarly pulls node 104 down, turning on p-channel 80. This holds node 110 to node 108, which has been driven to VCC by the inverter 88. This reconnects node 110 to inverter 88. The half-latch 84 and 86 pulls node 104 to ground for better drive in p-channel 80.

With node 110 thus at VCC, the drain (node 116) of PCOD 62 is not pulled below (VCC+VtP), thereby preventing stress on the gate oxide of PCOD 62.

When the output buffer 10 is driving low or is in high impedance, node 110 is either at VCC from the inverter 88, or at GPCASC, depending on history.

The output buffer 10 allows for VCC to be in the range of a nominal voltage ±10%, and for VDDQ to be in the range of approximately twice the VCC voltage. In one embodiment, the output buffer 10 allows for VCC in the range of approximately 1.65 V to approximately 1.95 V. The output and system VDDQ is in the range of approximately 3.0 V to approximately 3.6 V. In a preferred embodiment, VDDQ is equal to approximately 3.3 V and VCC and GPCASC are equal to approximately 1.8 V or approximately one-half of VDDQ. As a result of this arrangement, the voltages across the gate oxide of PCOD 62 and the gate oxide of NCOD 68 are approximately VCC or 1.8 V and these gate oxides are not overstressed, broken down, or otherwise damaged due to voltage swings on output 16 according to the values of data input 12 and enable input 14.

Although the present invention has been described above in connection with several embodiments, it should be understood that changes, substitutions, variations, alterations, transformations, and modifications may be suggested to one skilled in the art, and it is intended that the present invention encompass such changes, variations, substitutions, alterations, transformations, and modifications as fall within the spirit and scope of the appended claims.

What is claimed is:

1. An output buffer coupling a data input and an enable input to an output, the output buffer operable to receive a first voltage from a first power supply and a second voltage from a second power supply, the output buffer comprising:

a first output driver having a gate oxide;

a first output cascode coupled to the first output driver and to the output, the first output cascode having a gate, the first output cascode operable to protect the gate oxide of the first output driver from voltage changes on the output;

a switching circuit coupled to the enable input, to the data input, and to the gate of the first output cascode;

a second output driver having a gate oxide;

a second output cascode coupled to the second output driver and to the output, the second output cascode having a gate maintained at a substantially constant voltage, the second output cascode operable to protect the gate oxide of the second output driver from voltage changes of the output; and a level shifter coupled to the data input, to the enable input, and to the first output driver, the level shifter comprising a plurality of cascode devices and operable to provide a voltage to switch the first output driver according to the values of the data input and the enable input.

2. The output buffer of claim 1, wherein the substantially constant voltage is approximately equal to the second voltage when the second power supply is supplying power to the output buffer.

3. The output buffer of claim 1, wherein the second voltage is approximately equal to one half of the first voltage.

4. The output buffer of claim 1, wherein the switching circuit is operable to provide a gate voltage to the first output cascode, the gate voltage enabling the first output cascode to pull up with extra drive.

5. The output buffer of claim 4, wherein the gate voltage is approximately a threshold voltage above ground when the output is low.

6. The output buffer of claim 1, further comprising a first pre-driver logic circuit coupled to the data input, to the enable input, and to the level shifter.

7. The output buffer of claim 6, further comprising a second pre-driver logic circuit coupled to the data input and to the second output driver.

8. An output buffer coupling a data input and an enable input to an output, the output buffer operable to receive a first voltage from a first power supply and a second voltage from a second power supply, the output buffer comprising:

a first output driver having a gate oxide;

a first output cascode coupled to the first output driver and to the output, the first output cascode having a gate, the first output cascode operable to protect the gate oxide of the first output driver from voltage changes on the output;

a switching circuit coupled to the enable input and to the gate of the first output cascode, the switching circuit operable to provide extra drive to the output buffer; and a level shifter coupled to the data input, to the enable input, and to the first output driver, the level shifter comprising a plurality of cascode devices and operable to provide a voltage to switch the first output driver according to the values of the data input and the enable input.

9. The output buffer of claim 8, further comprising:

a second output driver having a gate oxide;

a second output cascode coupled to the second output driver and to the output, the second output cascode having a gate maintained at a substantially constant voltage, the second output cascode operable to protect the gate oxide of the second output driver from voltage changes of the output.

10. The output buffer of claim 9, wherein the substantially constant voltage is approximately equal to the second voltage when the second power supply is supplying power to the output buffer.

11. The output buffer of claim 8, wherein the second voltage is approximately equal to one half of the first voltage.

12. The output buffer of claim 8, wherein the switching circuit is operable to provide a gate voltage to the first output cascode, the gate voltage enabling the first output cascode to pull up with extra drive.

13. The output buffer of claim 12, wherein the gate voltage is approximately a threshold voltage above ground when the output is low.

14. The output buffer of claim 8, wherein the switching circuit comprises a plurality of transistors, wherein at least one of the transistors is coupled to a reference voltage.

15. The output buffer of claim 14, wherein the reference voltage is approximately equal to the second voltage.

16. The output buffer of claim 14, wherein the reference voltage is approximately equal to a maximum gate-drain voltage less than the first voltage.

17. A method for providing extra drive in an output buffer, the output buffer operable to couple a data input and an enable input to an output and operable to receive a first voltage from a first power supply and a second voltage from a second power supply, comprising the steps of:

coupling a first output cascode to the output and to a first output driver having a gate oxide, the first output cascode having a gate, the first output cascode operable to protect the gate oxide of the first output driver from voltage changes on the output;

coupling a switching circuit to the enable input and to the gate of the first output cascode, the switching circuit operable to provide extra drive to the output buffer;

coupling a level shifter to the data input, to the enable input, and to the first output driver, the level shifter comprising a plurality of cascode devices; and providing a voltage to switch the first output driver according to the values of the data input and the enable input.

18. The method of claim 17, further comprising coupling a second output cascode to the output and to a second output driver having a gate oxide, the second output cascode having a gate maintained at a second substantially constant voltage, the second output cascode operable to protect the gate oxide of the second output driver from voltage changes on the output.

19. The method of claim 17, wherein the step of coupling a switching circuit comprises providing a gate voltage to the first output cascode, the gate voltage enabling the first output cascode to pull up with extra drive.

20. The method of claim 19, wherein the gate voltage is approximately a threshold voltage above ground when the output is low.

* * * * *